US 6,528,853 B2

(12) United States Patent
Christensen et al.

(10) Patent No.: US 6,528,853 B2
(45) Date of Patent: Mar. 4, 2003

(54) METHOD AND SEMICONDUCTOR STRUCTURE FOR IMPLEMENTING DUAL PLANE BODY CONTACTS FOR SILICON-ON-INSULATOR (SOI) TRANSISTORS

(75) Inventors: Todd Alan Christensen, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/870,754

(22) Filed: May 31, 2001

(65) Prior Publication Data

US 2001/0026990 A1 Oct. 4, 2001

Related U.S. Application Data

(62) Division of application No. 09/478,036, filed on Jan. 5, 2000, now Pat. No. 6,287,901.

(51) Int. Cl.[7] .............................................. H01L 27/01
(52) U.S. Cl. ...................... 257/353; 257/347; 257/349; 257/351; 257/354; 257/621; 257/758
(58) Field of Search ................................ 257/353, 347, 257/351, 349, 354, 758, 621

(56) References Cited

U.S. PATENT DOCUMENTS

| 4,396,933 A | | 8/1983 | Magdo et al. |
| 4,700,454 A | * | 10/1987 | Baerg et al. .................. 437/24 |
| 4,814,287 A | | 3/1989 | Takemoto et al. |
| 5,008,723 A | | 4/1991 | van der Have |
| 5,116,771 A | | 5/1992 | Karulkar |
| 5,185,535 A | | 2/1993 | Farb et al. |
| 5,315,144 A | | 5/1994 | Cherne |
| 5,360,752 A | | 11/1994 | Brandy et al. |
| 5,376,561 A | | 12/1994 | Vu et al. |
| 5,559,368 A | | 9/1996 | Hu et al. |
| 5,627,395 A | * | 5/1997 | Wiek et al. .................. 257/350 |
| 5,670,388 A | | 9/1997 | Machesney et al. |
| 5,702,963 A | | 12/1997 | Vu et al. |
| 5,712,173 A | | 1/1998 | Liu et al. |
| 5,773,328 A | | 6/1998 | Blanchard |
| 5,795,800 A | | 8/1998 | Chan et al. |
| 5,804,858 A | | 9/1998 | Hsu et al. |
| 5,811,855 A | | 9/1998 | Tyson et al. |
| 5,818,085 A | | 10/1998 | Hsu et al. |
| 5,821,575 A | | 10/1998 | Mistry et al. |
| 5,877,046 A | | 3/1999 | Yu et al. |
| 5,889,293 A | | 3/1999 | Rutten et al. |
| 6,013,936 A | | 1/2000 | Colt, Jr. |
| 6,072,224 A | | 6/2000 | Tyson et al. |
| 6,110,769 A | * | 8/2000 | Son ........................... 438/164 |
| 6,121,659 A | * | 9/2000 | Christensen et al. ........ 257/347 |
| 6,143,582 A | | 11/2000 | Vu et al. |
| 6,188,122 B1 | * | 2/2001 | Davari et al. ................ 257/532 |
| 6,215,155 B1 | * | 4/2002 | Wollesen ..................... 257/351 |

FOREIGN PATENT DOCUMENTS

| EP | 552 697 A2 | * | 7/1993 |
| JP | 3-53534 | * | 3/1991 |
| JP | 2000332101 | | 11/2000 |
| WO | WO 93/20587 | * | 10/1993 |

* cited by examiner

Primary Examiner—Nathan J. Flynn
Assistant Examiner—Ahmed N. Sefer
(74) Attorney, Agent, or Firm—Joan Pennington

(57) ABSTRACT

A method and semiconductor structure are provided for implementing dual plane body contacts for silicon-on-insulator (SOI) transistors. A bulk silicon substrate is provided. A deep ion implant layer is implanted to reside below an oxide insulator. An oxygen implant layer is implanted while applying a mask to block the oxygen implant layer in selected regions. The selected regions provide for body contact for the SOI transistors. Holes are formed extending into the deep ion implant layer and the bulk silicon substrate. The holes are filled with an electrically conductive material to create stud contacts to the deep ion implant layer and the bulk silicon substrate.

2 Claims, 6 Drawing Sheets

METHOD AND SEMICONDUCTOR STRUCTURE FOR IMPLEMENTING DUAL PLANE BODY CONTACTS FOR SILICON-ON-INSULATOR (SOI) TRANSISTORS

This application is a divisional application of Ser. No. 09/478,036 filed on Jan. 5, 2000 now U.S. Pat. No. 6,287,901.

FIELD OF THE INVENTION

The present invention relates to a method and semiconductor structure for implementing dual plane body contacts for silicon-on-insulator (SOI) transistors.

1. Related Application

A related U.S. patent application Ser. No. 09/478,037, entitled "IMPLEMENTING CONTACTS FOR BODIES OF SEMICONDUCTOR-ON-INSULATOR (SOI) TRANSISTORS", by Todd Alan Christensen and John Edward Sheets II filed on Jan. 5, 2000, the same day as the present patent application.

2. Description of the Related Art

Silicon-on-insulator (SOI) technology is an enhanced silicon technology currently being utilized to increase the performance of digital logic circuits. By utilizing SOI technology designers can increase the speed of digital logic integrated circuits or can reduce their overall power consumption. These advances in technology will lead to the development of more complex and faster computer integrated circuits that operate with less power.

Silicon-on-insulator (SOI) transistors are built in a thin layer of silicon on top of a buried insulator, typically silicon dioxide, with bulk silicon below the buried insulator. FIGS. 1 and 2 illustrate a conventional SOI transistor. FIG. 1 illustrates a cross section through the width of a traditional SOI transistor. The SOI transistor has a polysilicon gate, a gate oxide over a thin silicon layer with isolation oxide, over a buried oxide, over the bulk silicon substrate. Performance of SOI transistors is increased due to reduced diffusion capacitance and due to floating body properties resulting in lower transistor threshold voltages. Since the voltage of the floating body can vary over time, the threshold voltage also varies. There are situations and circuits in which this effect is very undesirable. In these cases, there are known structures that can be used to connect the body of the SOI transistor to a known voltage. However, the known structures add much capacitance to the device, particularly gate capacitance, thus degrading the performance of these transistors so that is worse than a traditional bulk transistor. FIG. 2 illustrates a traditional body contact of a SOI transistor. Increased polysilicon area is needed to fabricate the traditional body contact. The increased polysilicon results in a large increase in capacitance of the SOI transistor, thus degrading performance.

The above-identified related patent application discloses a method for fabricating a body contact by using the bulk silicon as a connection through the buried oxide. This limits the use of a body contact to just one device type, N-channel field effect transistor (NFET) or P-channel field effect transistor (PFET) and to one voltage. A need exists for improved mechanism for implementing body contacts for silicon-on-insulator (SOI) transistors to allow connection to both NFETs and PFETs and to different voltages.

SUMMARY OF THE INVENTION

A principal object of the present invention is to provide a method and semiconductor structure for implementing dual plane body contacts for silicon-on-insulator (SOI) transistors. Other important objects of the present invention are to provide such a method and semiconductor structure for implementing dual plane body contacts for silicon-on-insulator (SOI) transistors without substantial negative effect and that overcome many of the disadvantages of prior art arrangements.

In brief, a method and semiconductor structure are provided for implementing dual plane body contacts for silicon-on-insulator (SOI) transistors. A bulk silicon substrate is provided. A deep ion implant layer is implanted to reside below an oxide insulator. An oxygen implant layer is implanted while applying a mask to block the oxygen implant layer in selected regions. The selected regions provide for body contact for the SOI transistors. Holes are formed extending into the deep ion implant layer and the bulk silicon substrate. The holes are filled with an electrically conductive material to create stud contacts to the deep ion implant layer and the bulk silicon substrate.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Having reference now to the drawings, in FIGS. 3–7, there are shown exemplary sequential steps for implementing dual plane body contacts for silicon-on-insulator (SOI) transistors in accordance with the preferred embodiment. In accordance with features of the invention, creation of a body contact is provided while maintaining the SOI performance advantage and without requiring any additional silicon area. The method of the invention provides the capability of having different voltages applied to sets of transistors by patterning an ion implant or a diffusion plane in the silicon substrate. This diffusion plane allows one to connect transistor bodies through the buried insulator to different body voltages.

In accordance with features of the invention, the body contact of the preferred embodiment is provided from underneath the SOI transistor body through the buried oxide. By patterning the bulk silicon under the buried oxide, multiple voltages can be applied to the bodies of transistors across the chip. This makes it possible to separately connect both N-channel field effect transistor (NFET) bodies and P-channel field effect transistor (PFET) bodies, each to a given voltage. It is also possible to have different voltages applied in an ion implant or implanted wiring layer just below the buried oxide. The SOI transistor bodies connected to the bulk would have to be at the same voltage.

Figure 1:
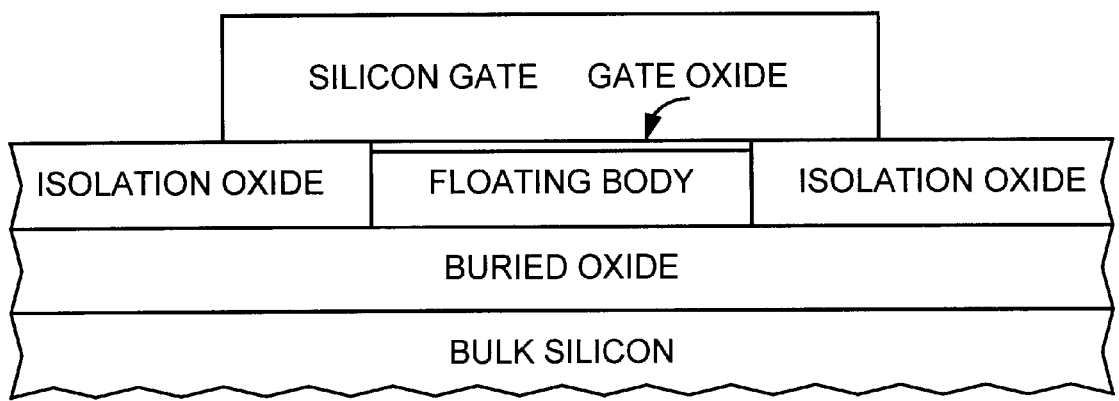
FIGS. 1 and 2 illustrate a conventional SOI transistor.
Figure 2:
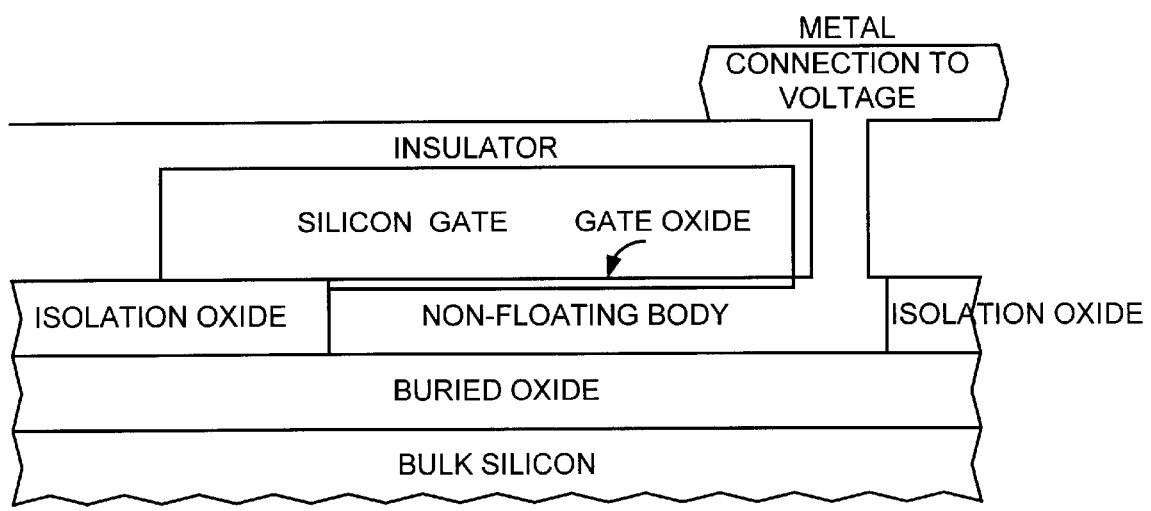
Figure 3:
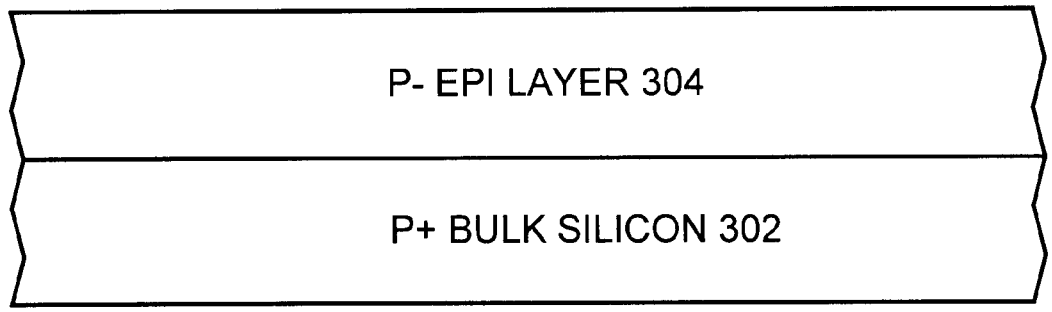
FIGS. 3, 4, 5, 6, and 7 are diagrams illustrating exemplary sequential steps for implementing dual plane body contacts for silicon-on-insulator (SOI) transistors in accordance with the preferred embodiment.

Referring now to FIG. 3, to start with a blank P+/P-Epi doped silicon substrate including a P+ bulk silicon 302 and a P-Epi layer 304 can be used to create a structure of the invention. It should be understood that a blank N+/N-Epi doped silicon substrate can also be used to create a structure of the invention.

Figure 4:
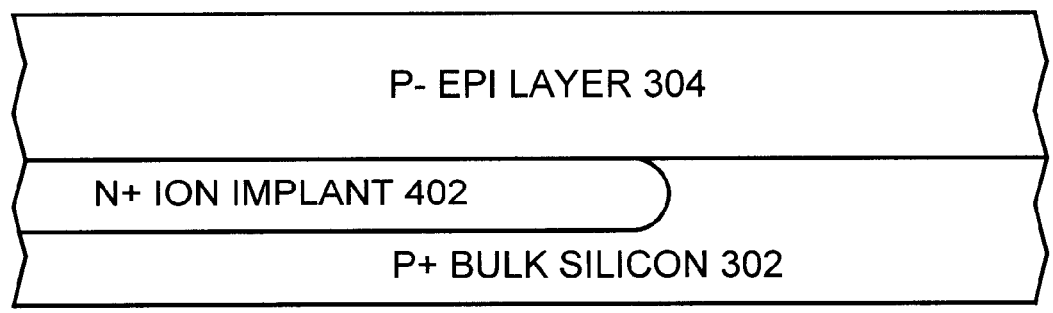

Referring to FIG. 4, a patterned deep N+ ion implant 402 is implanted that will reside just below an oxide insulator or buried oxide to be formed. The deep N+ ion implant 402 is patterned to reside only on the left side with a photoresist used to block the right side as shown in FIG. 4. Selected SOI transistor bodies to be formed in the P-Epi layer 304 are aligned with the patterned ion implant 402.

Figure 5:
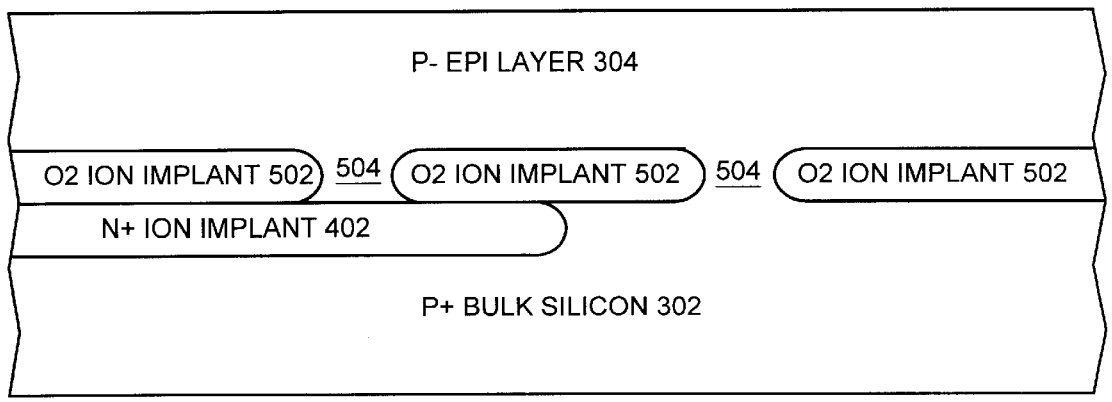

Referring to FIG. 5, next an oxygen ion implant 502 is used to create the buried oxide and is patterned with a mask applied to define a plurality of openings or regions 504 in which body contact is required.

Figure 6:
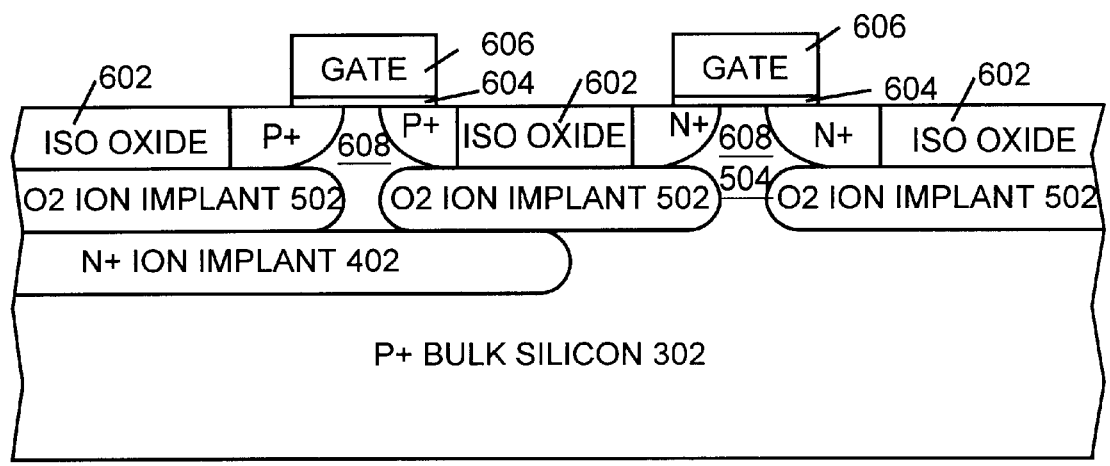

Referring to FIG. 6, next conventional processing to build the SOI transistor is continued including device isolation oxide 602, a gate oxide 604, a gate polysilicon 606, a body 608 and the like. Openings 504 in the buried oxide are aligned with selected SOI bodies 608.

Figure 7:
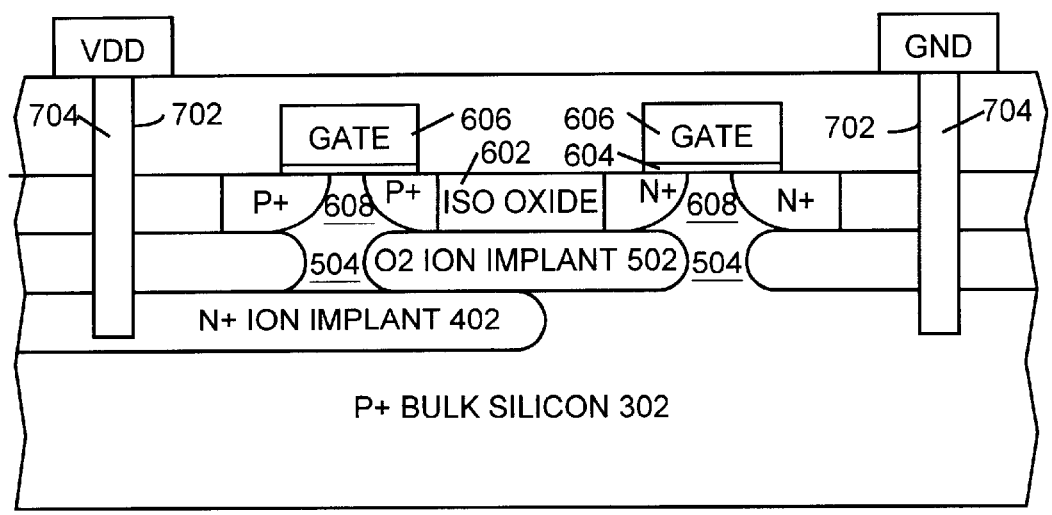

Referring to FIG. 7, prior to applying a first metallization layer at the level where a ground and voltage supply VDD connections are shown, deep holes 702 are simultaneously etched into the buried patterned implant 402 and the bulk silicon 302. Next the holes 702 are filled with an electrically conductive material 704, such as tungsten, copper, doped silicon or aluminum, thus creating stud contacts to these layers 402 and 302 that can be connected to voltage supplies or in some cases a varying voltage. Typically the connection to the bulk silicon 302 would be tied to ground and body contacts to NFETs would utilize this connection. The connection to the buried N+ ion implant would be tied to the high voltage supply VDD and this connection would be used for body contacts on PFETs.

While the present invention has been described with reference to the details of the embodiments of the invention shown in the drawing, these details are not intended to limit the scope of the invention as claimed in the appended claims.

What is claimed is:

1. A semiconductor structure for implementing dual plane body contacts for silicon-on-insulator (SOI) transistors comprising:

a bulk silicon substrate;

SOI transistors formed on said bulk silicon substrate; each of the SOI transistors including a SOI transistor body;

a patterned oxygen implant layer, said oxygen implant blocked in selected regions to create a buried oxide with openings; said buried oxide openings aligned with selected SOI transistor bodies for providing body contact for selected SOI transistors;

a patterned deep ion implant layer residing below said patterned oxygen implant in said bulk silicon substrate; said patterned deep ion implant layer aligned with first ones of said buried oxide openings for body contact with first ones of the selected SOI transistors;

said bulk silicon substrate for body contact with second ones of the selected SOI transistors;

electrically conductive contacts extending into said deep ion implant layer and said bulk silicon substrate; and said first ones of the selected SOI transistors including P-channel field effect transistors (PFETs) and said patterned deep ion implant layer is connected to a high voltage supply VDD and to said SOI transistor bodies of said PFETs.

2. A semiconductor structure for implementing dual plane body contacts for silicon-on-insulator (SOI) transistors as recited in claim 1 wherein said second ones of the selected SOI transistors include N-channel field effect transistors (NFETs) and said bulk silicon substrate is connected to ground and to said SOI transistor bodies of said NFETs.

* * * * *